(12) United States Patent
Sasaki

(10) Patent No.: US 7,876,641 B2
(45) Date of Patent: Jan. 25, 2011

(54) SEMICONDUCTOR INTEGRATED CIRCUIT

(75) Inventor: Tsuneki Sasaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 167 days.

(21) Appl. No.: 12/262,645

(22) Filed: Oct. 31, 2008

(65) Prior Publication Data

US 2009/0129196 A1 May 21, 2009

(30) Foreign Application Priority Data

Nov. 16, 2007 (JP) ............................. 2007-297665

(51) Int. Cl.
*G11C 8/00* (2006.01)

(52) U.S. Cl. .................... 365/233.1; 365/184

(58) Field of Classification Search ............. 365/233.1, 365/184
See application file for complete search history.

(56) References Cited

U.S. PATENT DOCUMENTS

| | | | |
|---|---|---|---|
| 5,511,029 A * | 4/1996 | Sawada et al. ............. 365/201 |
| 5,926,434 A | 7/1999 | Mori |
| 6,920,080 B2 * | 7/2005 | Chung et al. ........... 365/189.15 |
| 2001/0002181 A1 | 5/2001 | Kim et al. |
| 2004/0109382 A1 * | 6/2004 | Chung et al. ................. 365/233 |
| 2005/0002259 A1 | 1/2005 | Suyama |
| 2009/0129196 A1 * | 5/2009 | Sasaki ................... 365/233.11 |

OTHER PUBLICATIONS

United Kingdom Patent Office issued an United Kingdom Office Action dated Feb. 19, 2009, Application No. GB0819936.6.
L220 Cache Controller Technical Reference Manual, Revision: r1p7, http://infocenter. arm.com/help/topic/com.arm.doc.ddi0329i/ DDI0329.pdf), 2004-2007.

\* cited by examiner

*Primary Examiner*—Tuan T. Nguyen
(74) *Attorney, Agent, or Firm*—Young & Thompson

(57) ABSTRACT

A clock signal generation circuit into which a first clock signal and a control signal based on an address are inputted, and a second clock signal based on said first clock signal is generated after a lapse of predetermined time from said input of the control signal.

16 Claims, 11 Drawing Sheets

SEMICONDUCTOR INTEGRATED CIRCUIT

BACKGROUND OF THE INVENTION

1. Field of the Invention

The present invention relates to a semiconductor integrated circuit, and particularly relates to a semiconductor integrated circuit having a clock signal generation circuit.

2. Description of the Related Art

In recent years, semiconductor integrated circuits each including a memory 200 and a memory controller 100 like a semiconductor integrated circuit of a first conventional technique shown in FIG. 12 have been increasing. The memory controller 100 is provided for controlling the memory 200. In synchronization with a clock signal CLK, the memory controller 100 outputs an address ADDR, write data WD and memory control signals when writing data to the memory 200, and outputs the address ADDR and the memory control signals when reading data from the memory 200. Note that the memory control signals consist of: a chip select signal CS to activate a specific memory, a read/write signal nRW to differentiate between write and read operations (a signal indicating a read operation at a low level, and a write operation at a high level) and a byte write signal EN. Hereinafter, brief description will be given of the operations based on the first conventional technique.

As shown in FIG. 13, when writing data to the memory 200, the memory controller 100 performs the following operation. Specifically, at a time T1, the memory controller 100 outputs the address ADDR and the write data WD, and asserts the chip select signal CS and the read/write signal nRW, which are the memory control signals. Then, at a time T2 when a clock cycle after from the time T1, the memory controller 100 deasserts the memory control signals CS and nRW. Note that it is assumed that the condition that both the memory control signals CS and nRW are asserted indicates a write operation, and the condition that only the chip select signal CS is asserted indicates a read operation. Meanwhile, at the time T1 according to the clock signal CLK, the memory 200 receives the address ADDR, the write data WD and the asserted memory control signals CS and nRW, and then performs a write operation by writing the write data WD to a memory area specified by the address ADDR. Note that, in FIG. 12, the memory control signals are supplied to the memory 200 via an Inverter 300 so as to be received by the memory 200 as low active signals.

On the other hand, when reading data from the memory 200, the memory controller 100 performs the following operation. Specifically, at a time T1, the memory controller 100 outputs the address ADDR and asserts only the chip select signal CS of the memory control signals. Then, at the time T2, the memory controller 100 deasserts the chip select signal CS. At a time Tlat−1 after a lapse of a predetermined latency time from T1, the memory 200 outputs read data specified by the address ADDR in response to the chip select signal CS received at the time T1. The memory controller 100 receives the read data RD outputted at the time Tlat−1.

With the first conventional technique as described above, as can be seen from FIG. 13, the memory controller 100 outputs the chip select signal CS, the read/write signal nRW, the address ADDR, and the write data WD at the time T1, in writing. Therefore, the memory 200, which simultaneously receives these signals, can no longer secure a setup time of the address and the write data before receiving the chip select signal CS and the read/write signal nRW. As a result, a setup violation occurs.

A second conventional technique as shown in FIG. 14 is used in order to solve the setup violation. In other words, in the second conventional technique, when writing data to the memory 200, a flip flop 400 is placed for each of the chip select signal CS and the read/write signal nRW which are outputted from the controller 100 at the time T1, so that the chip select signal CS and the read/write signal nRW are supplied to the address ADDR after being delayed for two clock cycles as shown in FIG. 15. This enables the memory 200 to secure a setup time between: the address ADDR and the write data WD; and the chip select signal CS and the read/write signal nRW.

Related techniques to a memory controller for controlling a memory, as described above, is disclosed in L220 Cache Controller Revision rlp 7 Technical Reference Manual ARM (http://infocenter.arm.com/help/topic/com.arm.doc.ddi0329i/DDI0329.pdf).

The inventor of the present invention found out the following problem with the second conventional technique as described above. As an increasingly faster clock signal CLK is supplied to the memory, a setup time between the clock signal CLK and the control signals, consisting of the chip select signal CS, the read/write signal nRW and the byte write signal EN, cannot be secured in the second conventional technique shown in FIG. 14 either.

SUMMARY

A semiconductor integrated circuit according to the present invention is a clock signal forming circuit into which a first clock signal and a control signal based on an address are inputted. The semiconductor circuit includes a clock signal generation circuit generating a second clock signal based on the first clock signal after a lapse of predetermined time from the input of the control signals.

The above clock signal generation circuit makes it possible to control a time interval between the control signals and the second clock signal without making any changes in a circuit which outputs an address and control signals (for example, a RAM controller) and a circuit which is to receive these signals (for example, a RAM). Thus it is possible to satisfy the setup of circuits operating in response to these signals.

DESCRIPTION OF THE PREFERRED EMBODIMENTS

The best mode for carrying out the invention is a semiconductor integrated circuit having a clock signal generation circuit to which a first clock signal and control signals outputted at the same time as an address are inputted, and which generates a second clock signal based on the first clock signal after a lapse of predetermined time from the input of the control signals. In other words, since the clock signal generation circuit generates the second clock signal based on the control signals and the first clock signal, it is made possible to control a time interval between the control signals and the second clock signal. Accordingly, it becomes easy to satisfy the setup of a circuit operating in response to these signals (the setup between the control signals and the second clock signal).

Detailed descriptions will hereinafter be given of an embodiment with reference to the drawings.

Figure 1:
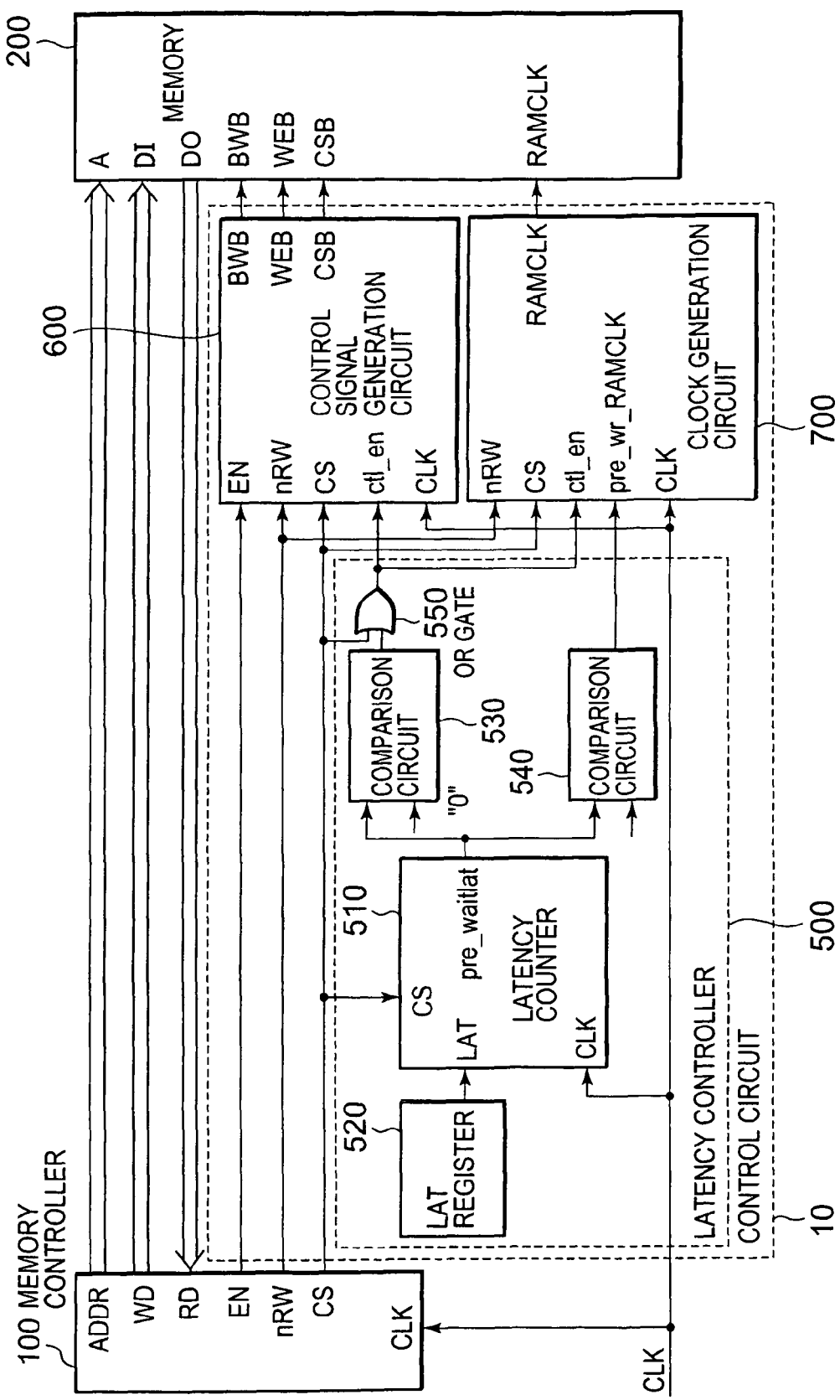
FIG. 1 is a block diagram showing an entire system according to an embodiment.
Figure 2:
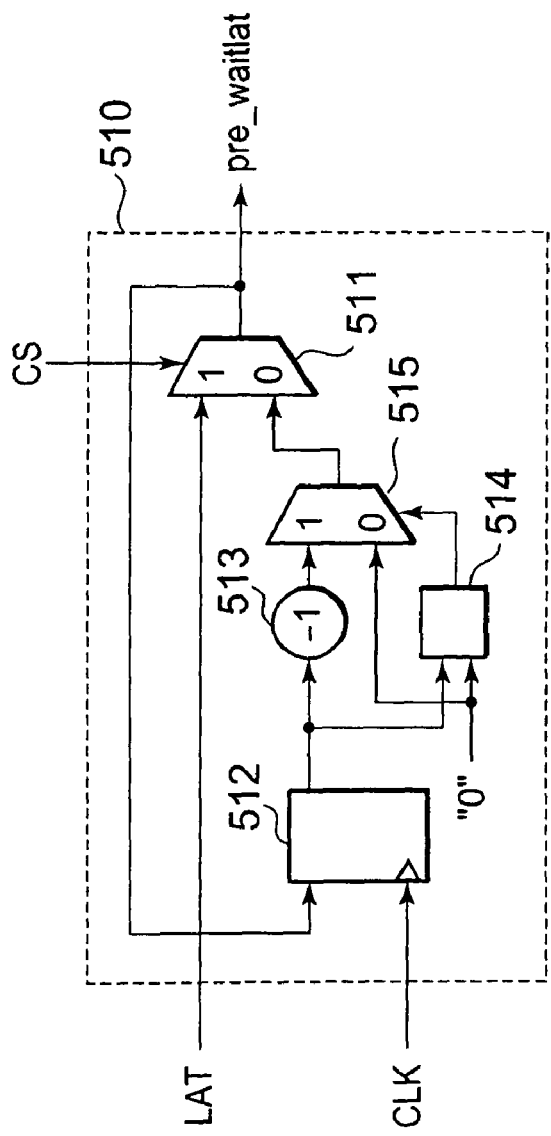
FIG. 2 is a circuit diagram of a latency counter.

As shown in FIG. 1, a control circuit 10 of the embodiment is connected between a memory controller 100 and a RAM 200. The control circuit 10 includes a latency controller 500, a control signal generation circuit 600, and a clock signal generation circuit 700.

Figure 3:
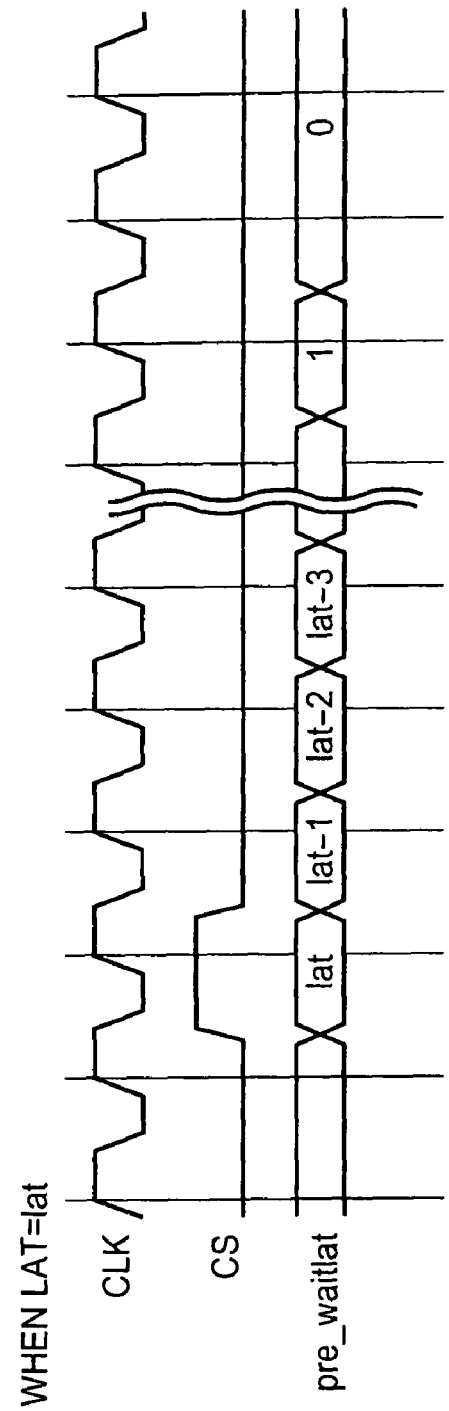
FIG. 3 is an operation timing chart of the latency counter.

The latency controller 500 is configured of: a LAT register 520 holding a latency value; a latency counter circuit 510 generating a pre_waitlat signal after receipt of a clock signal CLK, a chip select signal CS from the memory controller 100, and the latency value from the LAT register 520; a comparison circuit 530 outputting a result of a comparison between the pre_waitlat signal and "0"; a comparison circuit 540 outputting a result of a comparison between the pre_waitlat signal and "1"; and an OR circuit 550 generating a ctl_en signal by taking the OR of the output of the comparison circuit 530 with the chip select signal CS. In addition, the latency counter circuit 510 has: a selector 511 with two inputs and one output, which receives an output from the LAT register 520 at one input thereof, and selectively outputs data based on the chip select signal CS; a flip flop 512 holding and outputting data outputted by the selector 511 based on the clock signal CLK; a decrementer 513 decrementing and outputting output data after receipt of the output data from the flip flop 512; a comparison circuit 514 outputting a comparison result after comparing the output data of the flip flop 512 and "0"; and a selector 515 which the output of the decrementer 513 and "0" are inputted to, selects any one of them based on the comparison result of the comparison circuit 514, and outputs the selected result to the other input of the selector 511. As shown in FIG. 3, with such a circuit configuration, the latency counter circuit 510 captures the latency value LAT read from the LAT register 520 in response to the clock signal CLK when the chip select signal CS is asserted, and outputs the latency value LAT as the pre_waitlat signal. At the same time the latency counter circuit 510 outputs, as the pre_waitlat signal, a value repeatedly decremented at the decrementer 513 in response to the clock signal CLK and "0" at a point when the latency value LAT becomes "0" as a result of the decrement. As a result, a ctl_en signal is asserted when the chip select signal CS is asserted or when the pre_waitlat signal becomes "0". Moreover, a pre_wr_RAMCLK signal is asserted when the pre_waitlat signal becomes "1".

Figure 4:
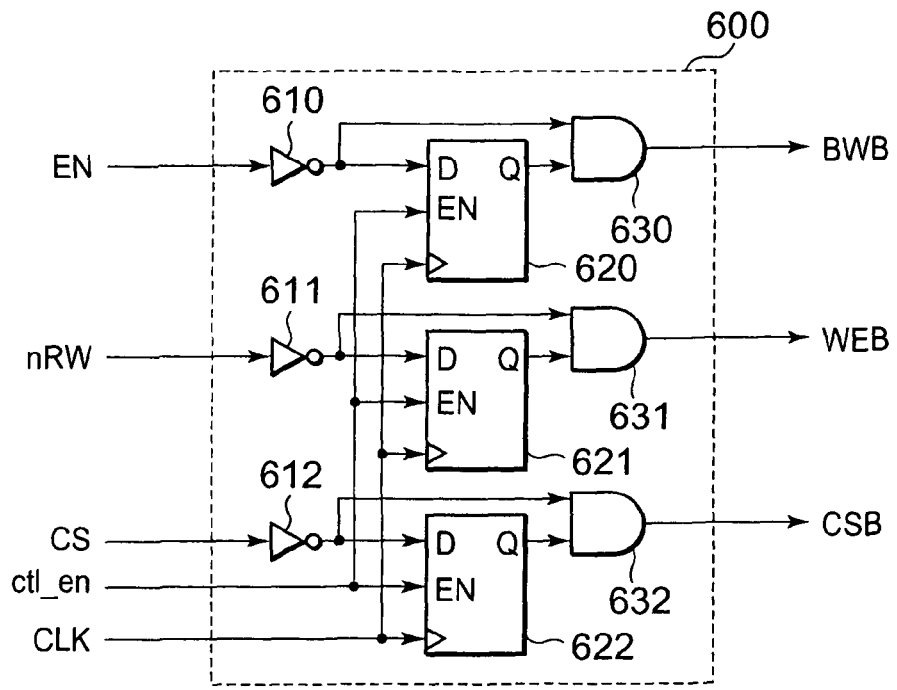
FIG. 4 is a circuit diagram of a control signal generation circuit.
Figure 5:
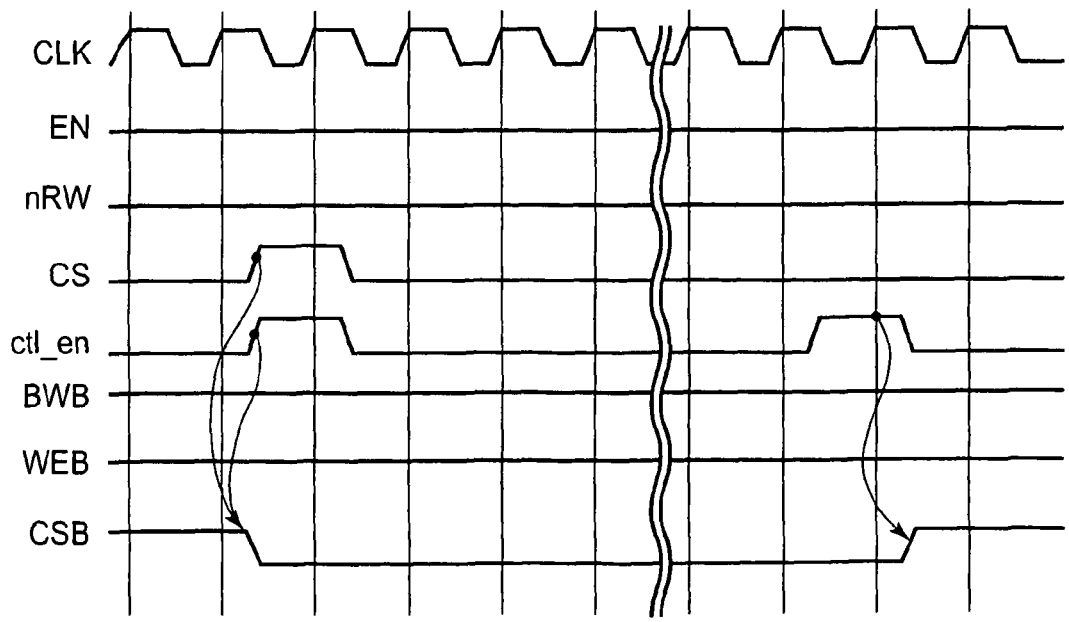
FIG. 5 is an operation timing chart of the control signal generation circuit in reading.
Figure 6:
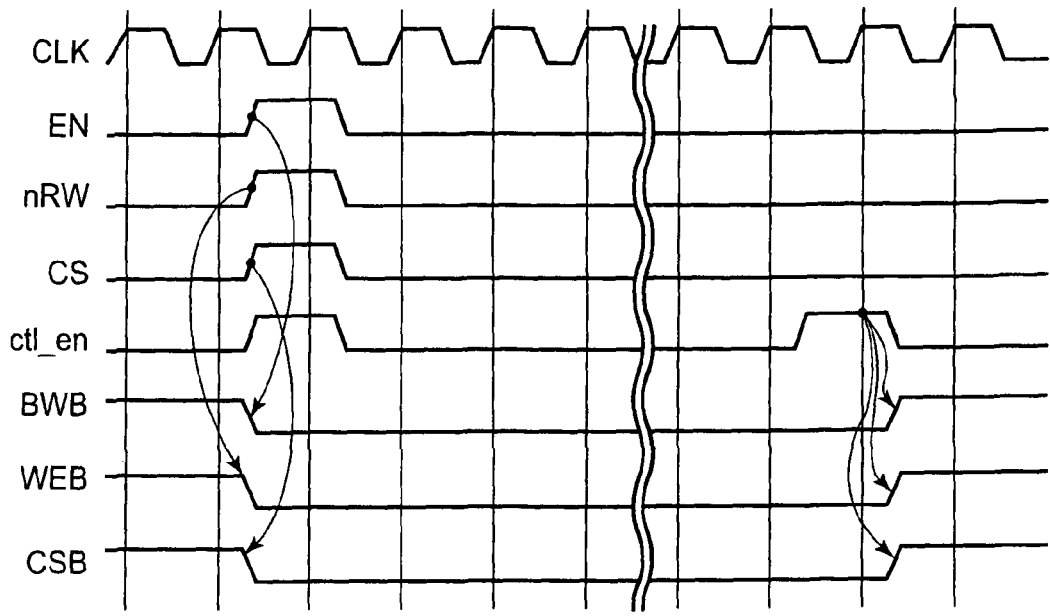
FIG. 6 is an operation timing chart of the control signal generation circuit in writing.
Figure 7:
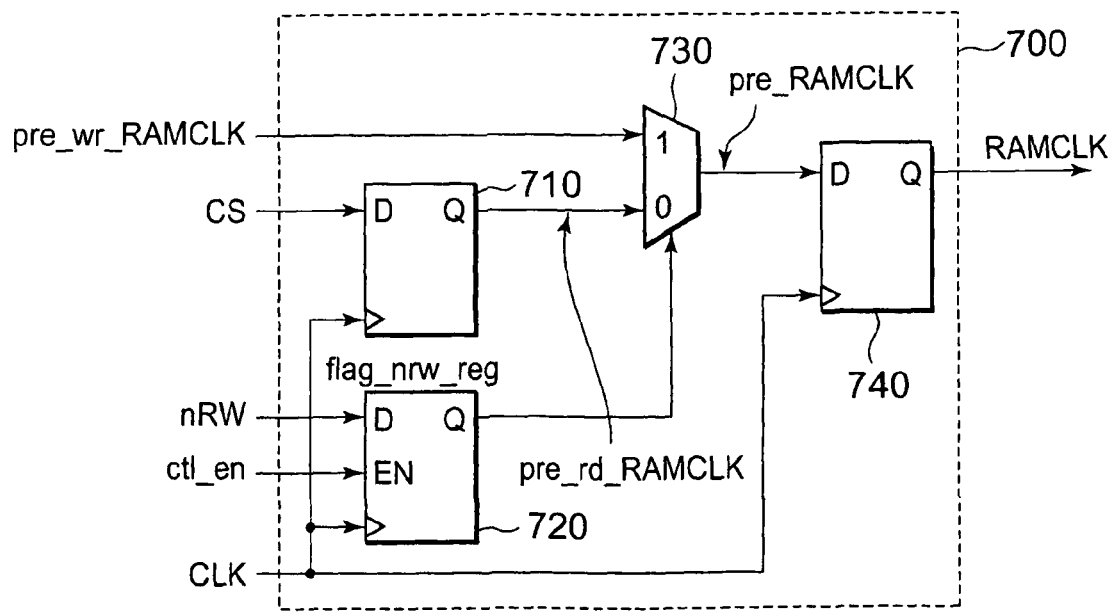
FIG. 7 is a circuit diagram of a clock generation circuit.

The control signal generation circuit 600 composing the control circuit 10 receives: the clock signal CLK; an EN signal, an nRW signal, and the chip select signal CS, which are outputted from the memory controller; and the ctl_en signal outputted from the latency controller 500, and generates a chip select signal CSB to be outputted to the memory 200. As shown in FIG. 4, the control signal generation circuit 600 is configured of: an inverter 610 inversely outputting the EN signal; an inverter 611 inversely outputting the nRW signal (a signal indicating a read operation at a low level and a write operation at a high level); an inverter 612 inversely outputting the chip select signal CS; a flip flop 620 where the ctl_en signal, output of the inverter 610 and the clock signal CLK is inputted to the enable terminal, the data input terminal, and the clock terminal, respectively; a flip flop 621 where the ctl_en signal, the output of the inverter 611 and the clock signal CLK is inputted to the enable terminal, the data input terminal and the clock terminal, respectively; a flip flop 622 where the ctl_en signal, the output of the inverter 612 and the clock signal CLK is inputted to the enable terminal, the data input terminal and the clock terminal, respectively; an AND gate 630 where the output of the inverter 610 and the output of the flip flop 620 are inputted to be outputted as a BWB signal; an AND gate 631 where the output of the inverter 611 and the output of the flip flop 621 are inputted to be outputted as a WEB signal; and an AND gate 632 where the output of the inverter 612 and the output of the flip flop 621 are inputted to be outputted as the chip select signal CSB. As shown in a timing chart in FIG. 5, in reading, the control signal generation circuit 600 with such configuration operates so that the chip select signal CSB is asserted in response to the chip select signal CS from the memory controller and a first ctl_en signal, and it is deasserted after the input of the next ctl_en signal. As shown in a timing chart in FIG. 6, in writing, the control signal generation circuit 600 operates so that the BWB signal and the WEB signal is asserted in addition to the chip select signal CSB in response to the chip select signal CS from the memory controller and the first ctl_en signal, and they are deasserted after the input of the next ctl_en signal.

Figure 8:
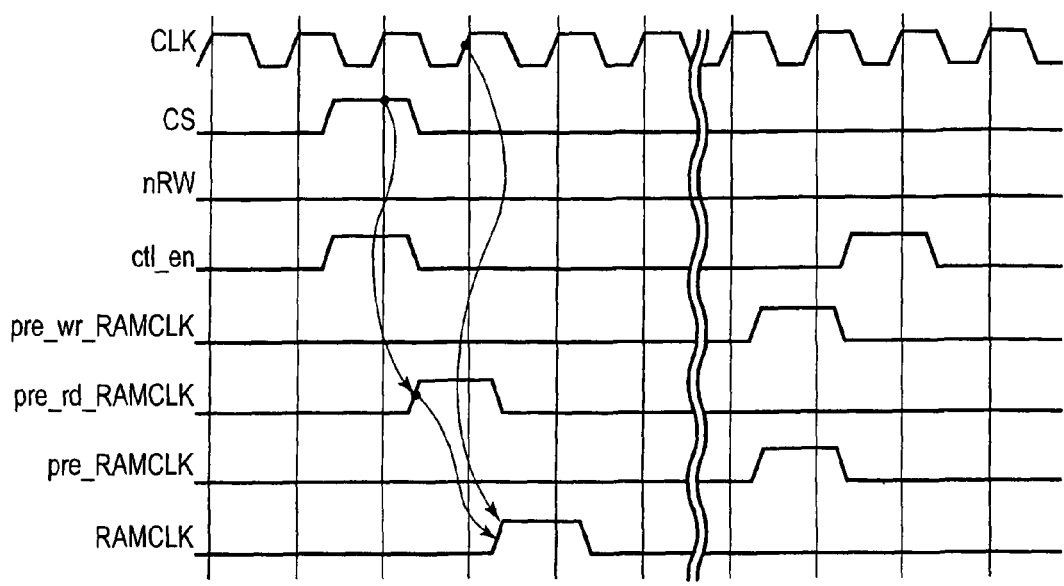
FIG. 8 is an operation timing chart of the clock generation circuit in reading.
Figure 9:
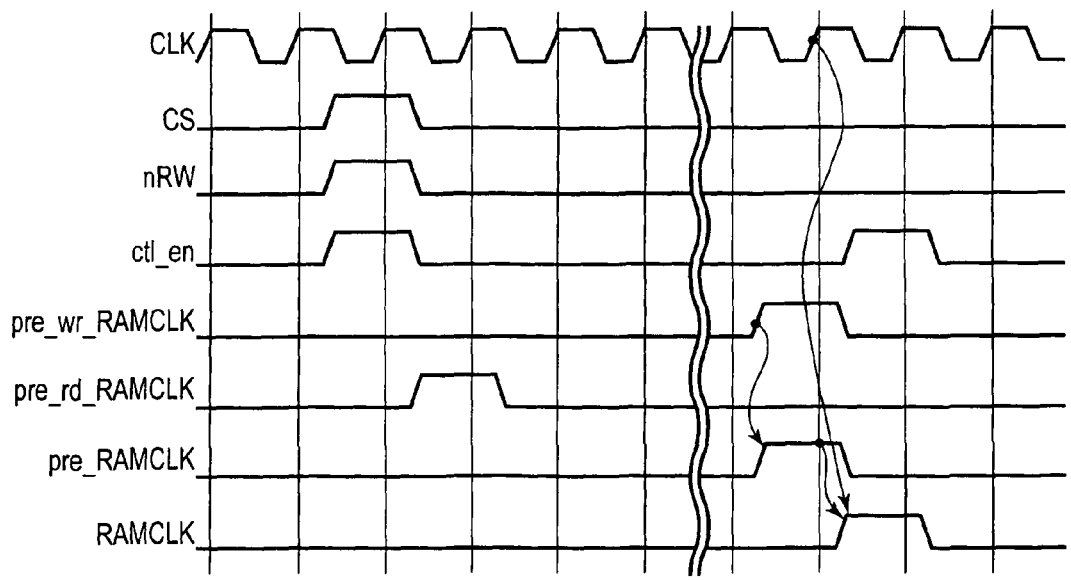
FIG. 9 is an operation timing chart of the clock generation circuit in writing.

The clock signal generation circuit 700 configuring the control circuit 10 receives the nRW signal and the chip select signal CS, which are outputted from the memory controller 100, the ctl_en signal and the pre_wr_RAMCLK signal and the clock signal CLK, which are outputted from the latency controller 500, and generates a RAMCLK signal. The clock signal generation circuit 700 is configured of: a flip flop 710 where the chip select signal is received at the data input terminal and the clock signal CLK is inputted to the clock terminal; a flip flop 720 where the nRW signal, the ctl_en signal and the clock signal is received at the data input terminal, the enable terminal and the clock terminal, respectively; a selection circuit 730 which receives a pre_wr_RAMCLK signal from the latency controller 500 at one input thereof and receives the output of the flip flop 710 at the other input thereof, and then outputs data by switching between the inputs, according to the output of the flip flop 720; and a flip flop 740 where the output of the selection circuit 730 is received at the data input terminal and the clock signal CLK is inputted to the clock terminal to output the RAMCLK signal. As shown in FIG. 8, when reading data from the memory 200, the clock signal generation circuit 700 captures the chip select signal CS at the flip flop 710 on the rising edge of the clock signal to output as a pre_rd_RAMCLK signal, and supplies the pre_rd_RAMCLK signal to the flip flop 740 through the selection circuit 730. The flip flop 740 captures the pre_RAMCLK signal on the rising edge of the clock signal CLK to output as a RAMCLK signal. In other words, in reading, the clock signal generation circuit 700 generates the RAMCLK signal from the chip select signal CS, delayed for one or more cycles of the clock signal CLK. Next, when writing data to the memory 200, as shown in FIG. 9, the clock signal generation circuit 700 causes the selection circuit 730 to select the pre_wr_RAMCLK signal by capturing the value of the nRW signal at a timing when the ctl_en signal of the clip flop 720 is asserted. Then, the flip flop 740 captures the asserted pre_wr_RAMCLK signal from the latency controller 500 in response to the clock signal CLK, and generates the RAMCLK signal to supply to the memory 200. In other words, in writing, the clock signal generation circuit 700 does not generate the RAMCLK signal for a period from when the chip select signal CS is asserted to when the pre_wr_RAMCLK signal is inputted, and generates the RAMCLK signal after the pre_wr_RAMCLK signal is inputted.

Figure 10:
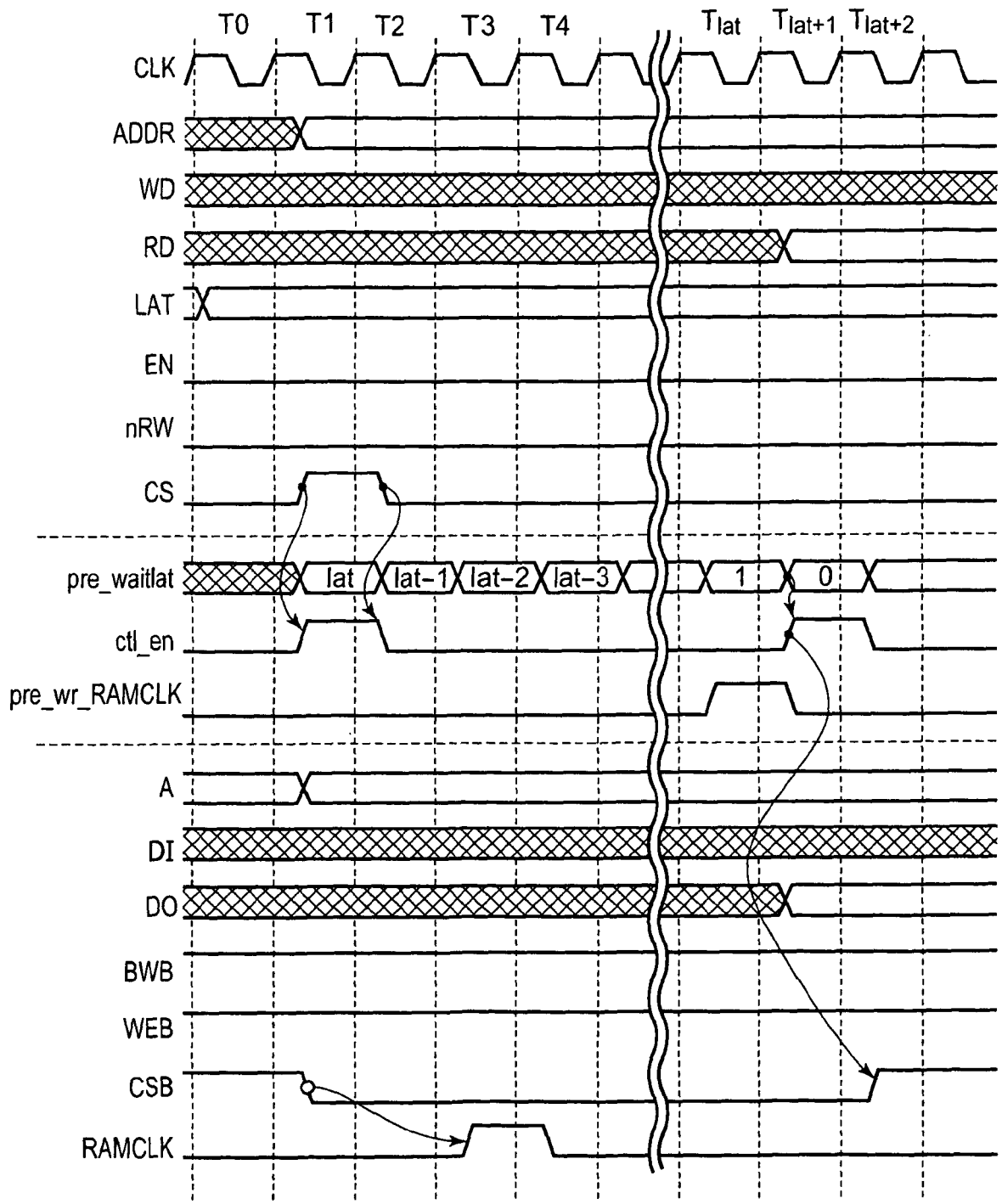
FIG. 10 is an operation timing chart in reading, according to the block diagram of the embodiment.
Figure 11:
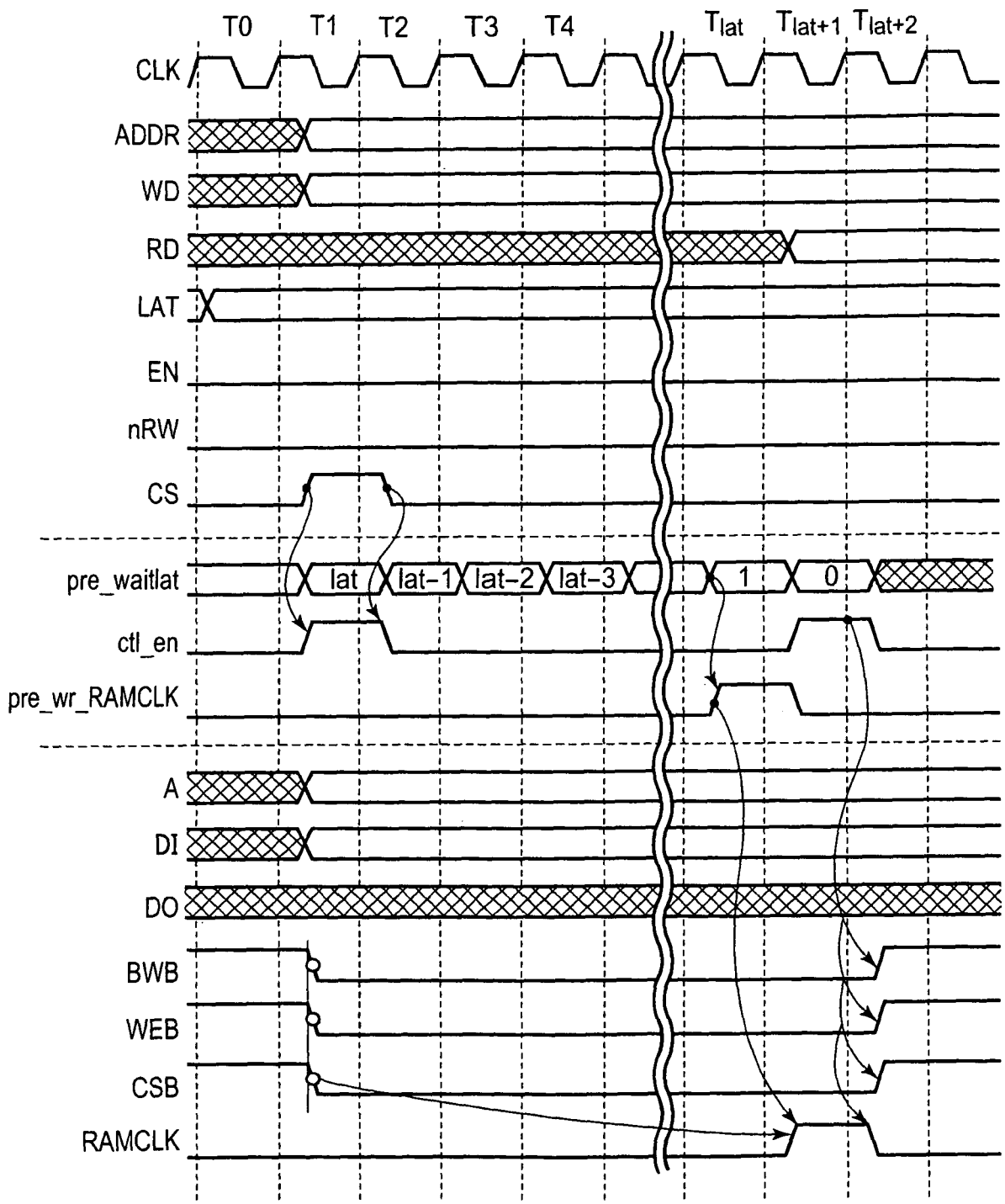
FIG. 11 is an operation timing chart in writing, according to the block diagram of the embodiment.
Figure 12:
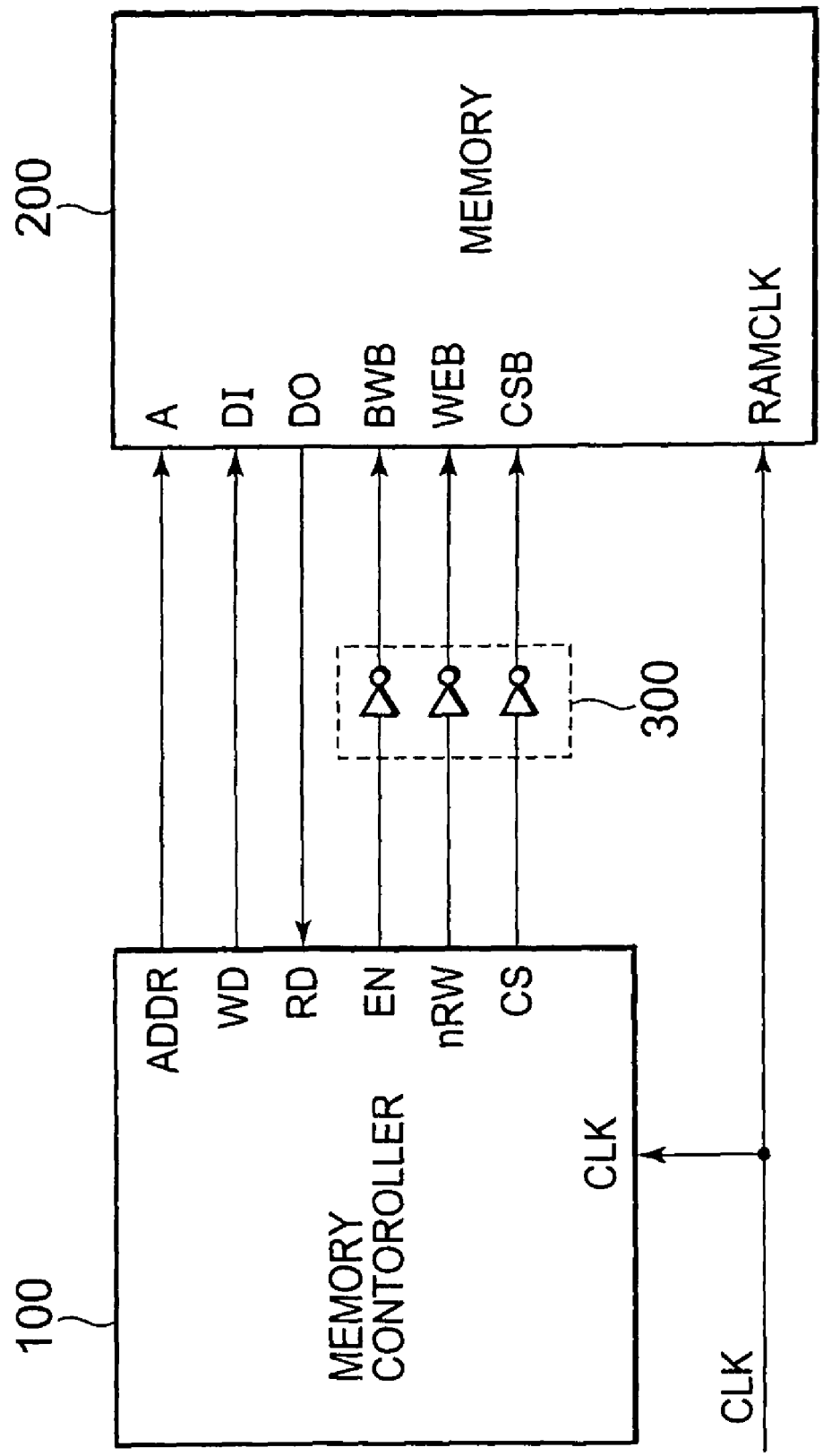
FIG. 12 is a block diagram according to a first conventional technique.
Figure 13:
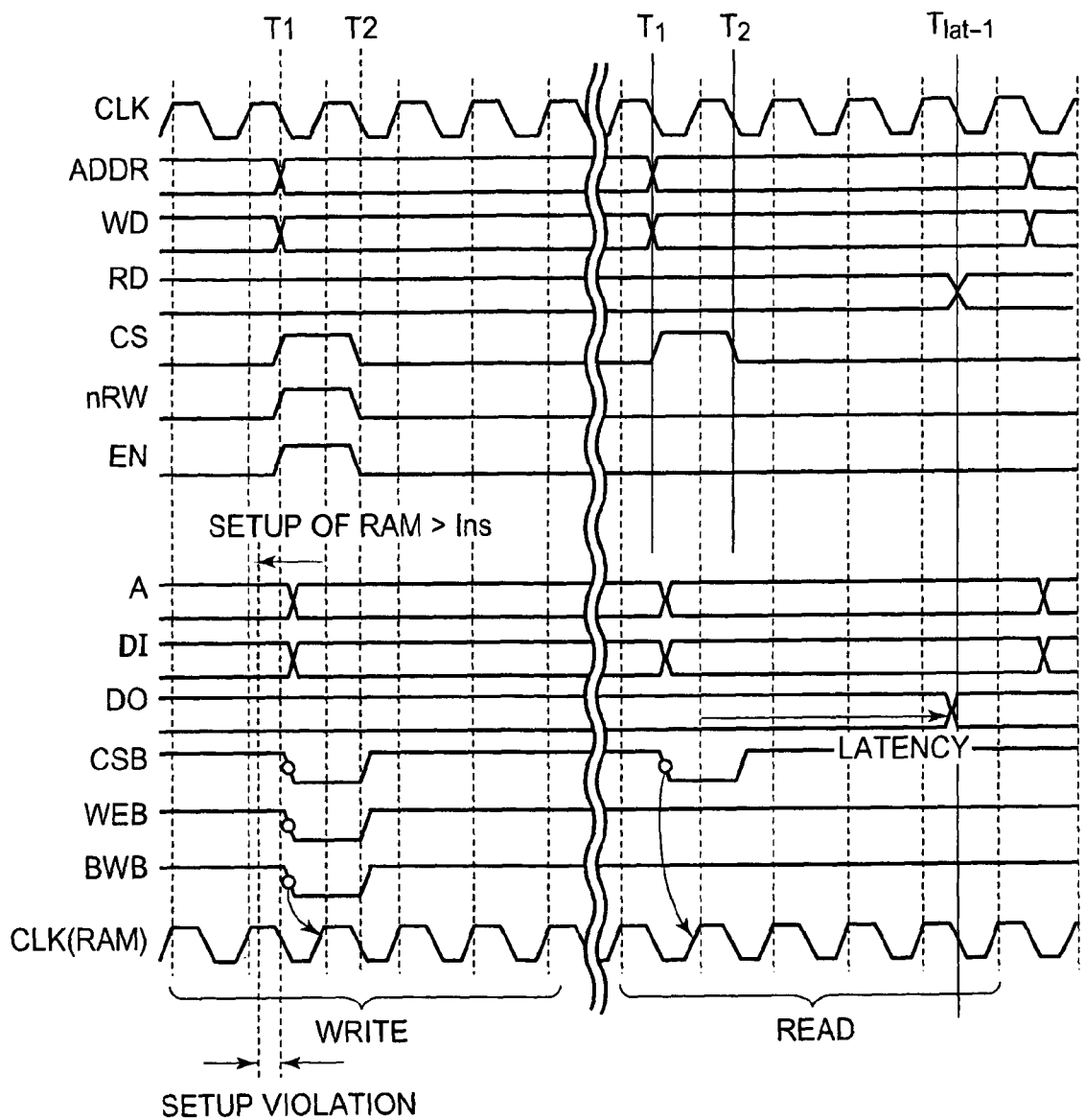
FIG. 13 is a timing chart of write and read operations according to the first conventional technique.
Figure 14:
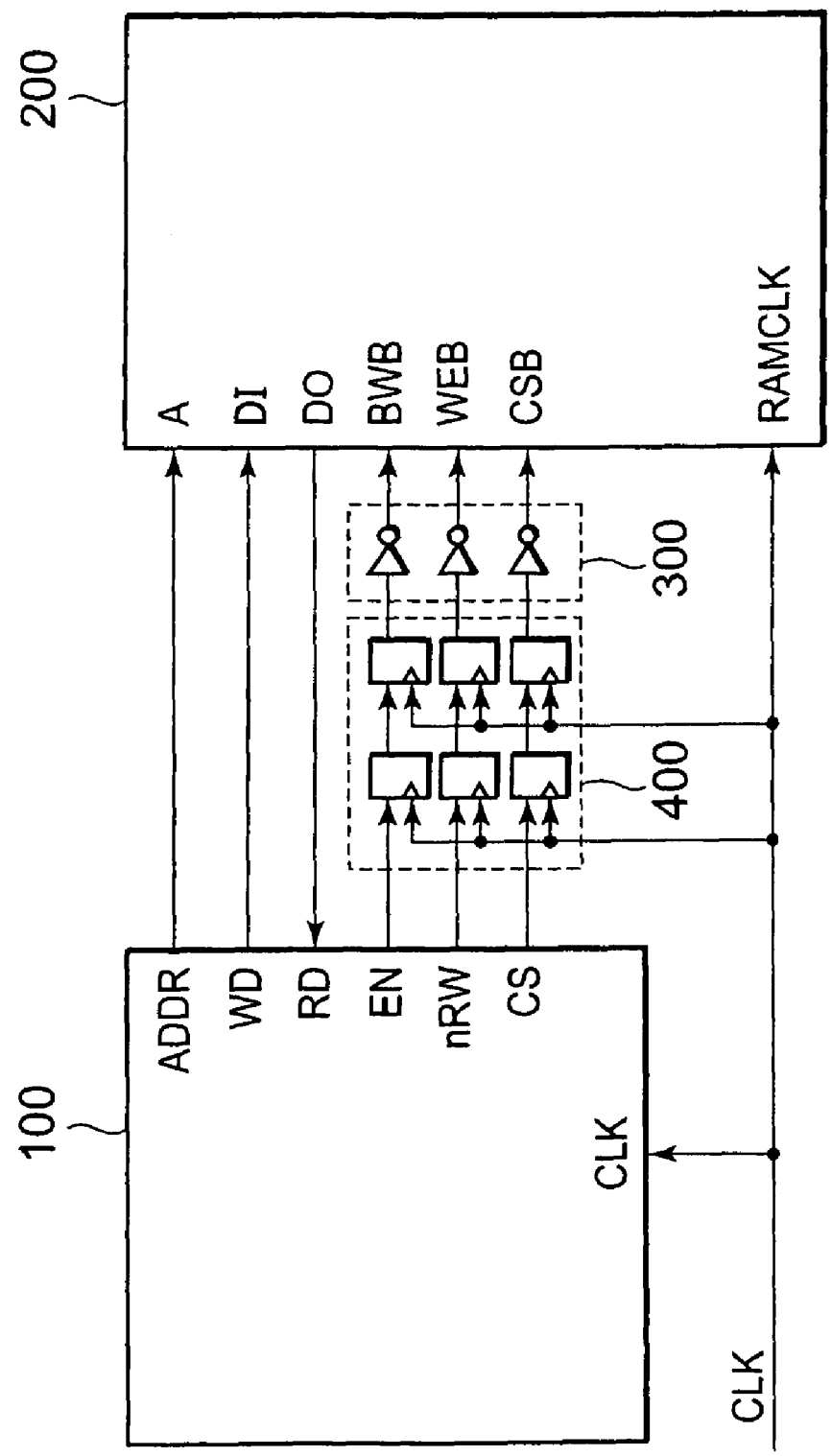
FIG. 14 is a block diagram according to a second conventional technique.
Figure 15:
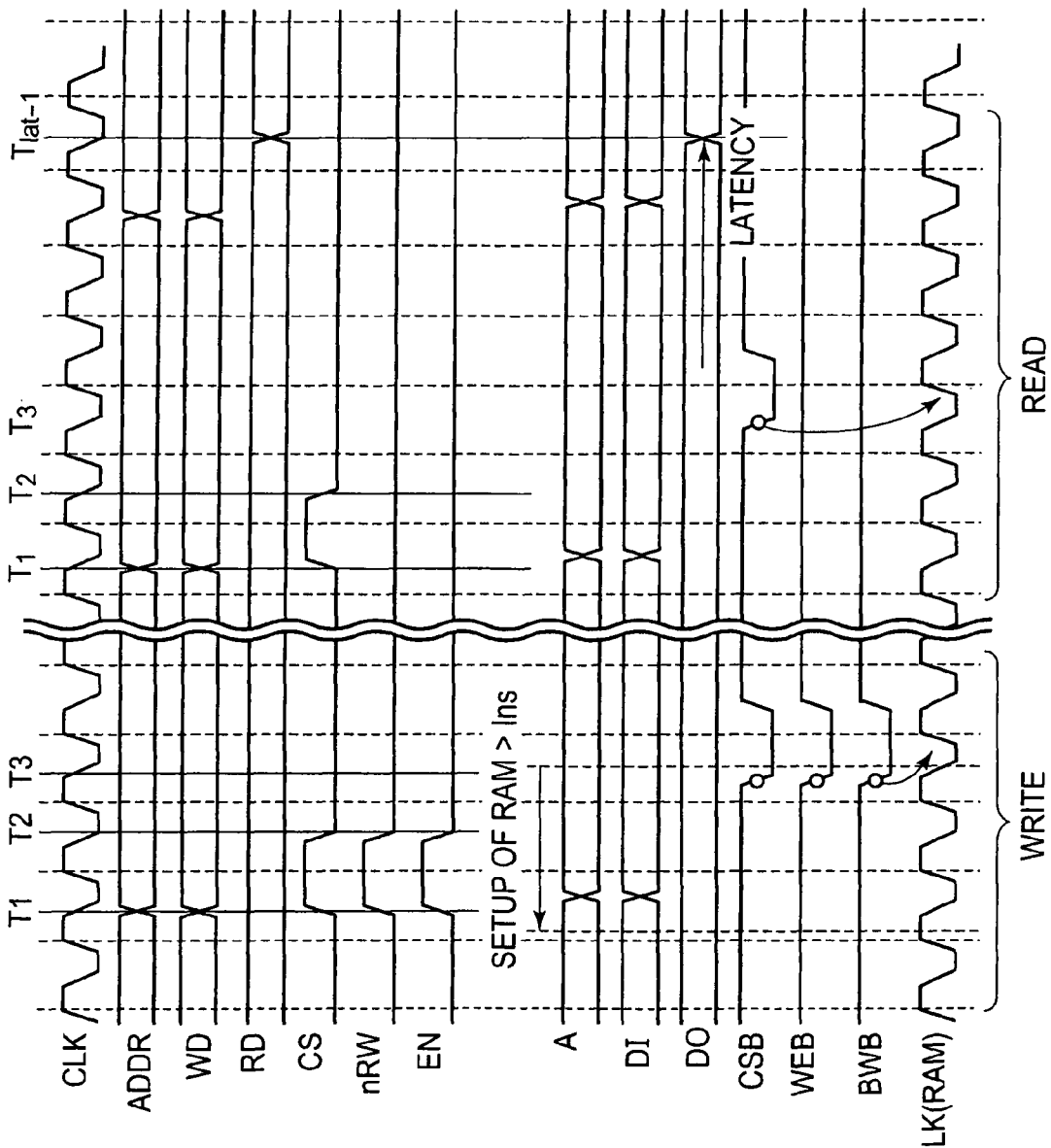
FIG. 15 is a timing chart of write and read operations according to the second conventional technique.

The above are the descriptions of the operations of each circuit block, but the following are descriptions of the operations of the whole with reference to FIGS. 10 and 11.

Firstly, descriptions will be given of a case where the memory controller 100 reads data from the memory 200. Note that signals which are outputted by each block, but are not directly related to a write operation are described in the drawings. However, the descriptions of the signals which are not directly related to the write operation will be omitted for simplicity. As shown in FIG. 10, the memory controller 100 writes the latency value LAT to the LAT register 520 at a time T0, and then asserts the address ADDR and the chip select signal CS at a time T1. The latency controller 500, which received the chip select signal CS at the time T1, read the latency value LAT from the LAT register 520 and asserts the ctl_en signal based on the chip select signal CS, and, at a time T2, deasserts the ctl_en signal. The control signal generation circuit 600 causes the chip select signal CSB (low active) supplied to the memory 200 to fall in response to the chip select signal CS at the time T1. The clock generation circuit 700 outputs the RAMCLK signal at a time T3 which is delayed two clock cycles by causing the chip select signal CS outputted from the memory controller 100 at the time T1 to travel through the latch circuits 710 and 740. At the time T3, the memory 200 starts the operation in response to the RAMCLK signal, and captures the address ADDR and the chip select signal CSB on the rising edge of the RAMCLK signal. At this point, there is a margin of two clock cycles between: the address ADDR and the chip select signal CSB; and the RAMCLK signal. Therefore, it is possible to satisfy the setup between: the RAMCLK signal; and the address signal and the chip select signal CSB being the control signal.

The memory 200 outputs, as read data RD, corresponding data based on the address ADDR received at the time T3, at a time Tlat+2. In response to a fact that the pre_waitlat signal has become "0" at a time Tlat+1, the latency controller 500 asserts the ctl_en signal to supply to the control signal generation circuit 600. The control signal generation circuit 600, which has received the ctl_en signal, makes the chip select signal CSB inactive. Here the chip select signal CSB is made active from the time T1 when the chip select signal CS was asserted to the time Tlat+1. Thereafter, the control signal generation circuit 600 completes the read operation of the memory 200.

Here, when it takes five clock cycles of the clock signal CLK from the input of the RAMCLK signal to the output of the data, the latency value LAT can be set to 5+2 (being equal to two latch circuits in the clock generation circuit)=7.

Next, descriptions will be given of a case where the memory controller 100 writes data to the memory 200. As shown in FIG. 11, the memory controller 100 writes the latency value LAT to the LAT register 520 at a time T0. The memory controller 100 then outputs the address ADDR and the write data WD at a time T1, and asserts the chip select signal CS. The latency controller 500, which received the chip select signal CS at the time T1, reads the latency value LAT from the LAT register 520 and asserts the ctl_en signal based on the chip select signal CS. The latency controller 500 deasserts the ctl_en signal at a time T2. The control signal generation circuit 600 causes the chip select signal CSB and the write signal WEB (low active), which are to be supplied to the memory 200, to fall in response to the chip select signal CS at the time T1. Similarly, the control signal generation circuit 600 causes the BWB signal (low active) to fall when the byte write signal EN is asserted. The clock generation circuit 700 generates the RAMCLK signal at a time Tlat+1 in response to the pre_wr_RAMCLK signal when the pre_wr_RAMCLK signal outputted from the latency controller 500 becomes "1", that is, at the time Tlat. The value of pre_waitlat signal becomes "1" at the time Tlat, and the latency controller 500 outputs "1" as the pre_wr_RAMCLK signal since the value of pre_waitlat signal agrees with "1" as the result of a comparison of the value and "1" by a comparator 540. The pre_waitlat signal becomes "0" at the time Tlat+1, and the latency controller 500 asserts the ctl_en signal. The control signal generation circuit 600, which has received the asserted ctl_en signal, causes the BWB signal, the WEB signal, and the CSB signal to rise at a Tlat+2 in order to make them inactive. Delaying the generation of the RAMCLK signal in response to the latency value LAT in this manner makes it possible to secure a setup time in writing by appropriately setting the latency value LAT, even if the clock signal CLK becomes faster still.

As described above, in the embodiment, since the generation of the RAMCLK signal is delayed for a predetermined time from the chip select signal CS being the control signal, it is possible to readily secure setup times for the control signal and the RAMCLK signal even if the frequency of the clock signal CLK becomes higher.

Moreover, even if the clock of the memory controller 100 is a high-speed clock such as a system clock, and a clock signal is supplied to the RAM 200, it is possible to meet the limit on the cycle time of the RAM.

Furthermore, it is possible to independently set the setup times for a read operation and a write operation by changing the latency value LAT in reading and writing. Accordingly, flexibility is increased.

Note that, in the embodiment, although the descriptions have been given of the case where the memory controller 100 writes the latency value LAT to the LAT register 520 at the time 0, it may be written at any time as long as the write operation is completed before the latency value is required by the latency controller 500.

Additionally, in the embodiment, although the descriptions have been given of a case of using a one-shot pulse as the RAMCLK signal, it may be configured in a manner that the RAMCLK signal for the read operation or the write operation is provided to the memory 200 after being delayed for a predetermined time from the chip select signal CS outputted from the memory controller. Moreover, it is possible to reduce power consumption at the memory and the clock generation circuit by dividing the RAMCLK signal to a lower-speed clock than the clock signal CLK, and also it is possible to reduce the foot pattern and the cost since a RAM requiring a high-speed RAMCLK signal is not needed.

In addition, since the above control circuit 10 is inserted between the memory controller and the memory, there is no need to change the designs of the memory controller and the memory. Accordingly, it is possible to use conventional ones as they are. Therefore, it is possible to reduce the cost of a design change and shorten a design time.

Furthermore, in the present embodiment, it has been described that in the generation of the RAMCLK signal in reading, the chip select signal CS is delayed for two clock cycles and outputted, by causing the signal to travel through the flip flops 710 and 740. However, it is possible to delay one more clock cycle by further adding another flip flop, on the path of the chip select signal CS before the data input terminal D of the flip flop 710. The flip flop is similar to the flip flop 710, and the data output terminal Q thereof is connected to the data input terminal D of the flip flop 710. The flip flop receives the chip select signal CS and the clock signal CLK at the data input terminal and the clock input terminal, respectively. It is possible to facilitate the setup in reading by (N+1) clock cycles by inserting such N flip flops. Additionally, another LAT register and a latency counter receiving the output of the LAT register (with the same configuration as that of the latency counter 510) may be provided. In such configuration, the value of the LAT register may be changed by using the chip select signal CS inputted to the clock generation circuit, as the control signal to be supplied to the flip flop 710, in reading of the output. Thus, it is possible to arbitrarily set a period from when the chip select signal is issued to when the RAMCLK signal is outputted based on the value of the LAT register.

It is apparent that the present invention is not limited to the above embodiments, but may be modified and changed without departing from the scope and spirit of the invention.

What is claimed is:

1. A semiconductor integrated circuit comprising:
  a clock signal generation circuit being inputted into which a first clock signal and a control signal based on an address, and generating a second clock signal based on said first clock signal after a lapse of predetermined time from said input of said control signal,
  wherein the predetermined time is no less than one cycle of said first clock signal.

2. The semiconductor integrated circuit according to claim 1, wherein,
  in a first mode, said clock signal generation circuit outputs said second clock signal based on said first clock signal, after being delayed for a first delay time from said control signal; and
  in a second mode, said clock signal generation circuit outputs said second clock signal based on said first clock signal, after being delayed for a second delay time from said control signal.

3. The semiconductor integrated circuit according to claim 1, further comprising:
  a control signal controller that outputs said address and said control signal in synchronization with said first clock signal upon receipt of said first clock signal.

4. The semiconductor integrated circuit according to claim 3, further comprising:
  a memory which operates upon receipt of said address, said control signal, and said second clock signal.

5. The semiconductor integrated circuit according to claim 1, wherein
  said clock signal generation circuit outputs a one-shot pulse as said second clock signal.

6. The semiconductor integrated circuit according to claim 1, wherein
  said clock signal generation circuit generates said second clock signal by dividing said first clock signal.

7. The semiconductor integrated circuit according to claim 2, wherein
  said second delay time is greater than said first delay time.

8. The semiconductor integrated circuit according to claim 1, wherein
  said control signal is a chip select signal for selecting a specified circuit from a plurality of circuits to which said second clock signal is to be supplied.

9. The semiconductor integrated circuit according to claim 2, wherein, in said first mode,
  said clock signal generation circuit generates said second clock signal based on a chip select signal, said chip select signals being inputted as said control signal.

10. The semiconductor integrated circuit according to claim 2, wherein, in said second mode,
  said clock signal generation circuit generates said second clock signal based on a chip select signal, a R/W signal indicating a write mode, and a PreWait signal, each of the chip select signals, said R/W signal and said PreWait signal being inputted as said control signal.

11. The semiconductor integrated circuit according to claim 1, further comprising:
  a control signal generation circuit receiving said control signal to assert another control signal for another predetermined time from said input of said control signal,
  wherein said predetermined time is shorter than said another predetermined time.

12. The semiconductor integrated circuit according to claim 11, further comprising:
  a latency register holding an externally programmed latency value,
  wherein said another predetermined time is determined based on the latency value.

13. A control circuit, comprising:
  a control signal generation circuit receiving a first control signal to assert a second control signal for a first period from a first time point in response to the edge of the first control signal; and
  a clock generation circuit receiving a first clock signal and being responsive to the first control signal to generate a second clock signal after a second period from the first time point,
  wherein the second period is no less than one cycle of the first clock signal and shorter than the first period.

14. The control circuit according to claim 13, further comprising:
  a latency register holding an externally programmed latency value,
  wherein the first period is determined based on the latency value.

15. The control circuit according to claim 14,
  wherein the clock generation circuit does not generate the second clock signal for the second period from the first time point.

16. The control circuit according to claim 15,
  wherein the clock generation circuit being further responsive to a third control signal indicating a write operation, and
  wherein the second period is determined based on the latency value when the third control signal is asserted.

* * * * *